United States Patent [19]
Yasuda et al.

[11] Patent Number: 5,920,152
[45] Date of Patent: Jul. 6, 1999

[54] MERCURY LAMP OF THE SHORT ARC TYPE AND METHOD FOR OPERATION THEREOF

[75] Inventors: Yukio Yasuda; Masanori Sugihara; Shouichi Mayama, all of Himeji, Japan

[73] Assignee: Ushiodenki Kabushiki Kaisha, Tokyo, Japan

[21] Appl. No.: 08/938,749

[22] Filed: Sep. 26, 1997

[30] Foreign Application Priority Data

Sep. 27, 1996 [JP] Japan .................................... 8-275282

[51] Int. Cl.⁶ .................................................... H01J 17/04
[52] U.S. Cl. ........................ 313/571; 313/570; 313/642; 313/632
[58] Field of Search ...................... 313/571, 570, 313/631, 632, 621, 642

[56] References Cited

U.S. PATENT DOCUMENTS 4,190,786  2/1980  Kira .
4,704,346  11/1987  Hiramoto et al. ....................... 313/571
5,723,944  3/1998  Higashi et al. ......................... 313/570

*Primary Examiner*—Nimeshkumar D. Patel
*Attorney, Agent, or Firm*—Sixbey, Friedman, Leedom & Ferguson; David S. Safran

[57] ABSTRACT

A mercury lamp of the short arc type with high radiant efficiency which satisfies the demand for an increase of the radiation amount of the light source, by suppressing the motion of the bright spot in the vicinity of the cathode tip suppresses the flickering of the irradiance and thus increases the arc stability, is achieved in a mercury lamp of the short arc type in which within an arc tube mercury and at least one rare gas are encapsulated, by either at least Ar being filled as the rare gas at an filling pressure of from 1 to 8 atm, and by the current density in the tip area of the cathode being 10 to 250 A/mm² or alternatively, at least Kr being filled as the rare gas at an filling pressure of from 1 to 8 atm, and the current density in the tip area of the cathode being 10 to 310 A/mm² during operation of the lamp. By operation of the above described lamp in a vertical orientation with the anode positioned above the cathode a further contribution to the attainment of the noted advantages is achieved.

8 Claims, 3 Drawing Sheets

Current Density of the Tip (A/mm²).
Relation between the Current Density of the Tip and the Stability

MERCURY LAMP OF THE SHORT ARC TYPE AND METHOD FOR OPERATION THEREOF

BACKGROUND OF THE INVENTION

1. Field of the Invention

The invention relates to a mercury lamp of the short arc type which has high focussing efficiency and good intensity light stability, and which is usable for a semiconductor exposure device.

2. Description of Related Art

In the exposure process for manufacturing of semiconductors, a mercury lamp of the short arc type which emits UV light with a primary wavelength of 365 nm (hereinafter called "i-line") has recently been used. Since the degree of integration of the integrated circuit of the semiconductor increases each year, there is accordingly a higher and higher demand for image resolution during exposure. Furthermore, due to the enlargement of the exposure surface, as a result of the increase of the wafer aperture or due to the modified illumination technique which is used to achieve high image resolution, there is a need to increase the amount of radiation of the UV light from the light source.

Furthermore, enormous plant investment is necessary to build a production line for semiconductor manufacture. For capital yield for this purpose there is, therefore, also a demand for increasing the throughput in terms of the production amount per unit of time. Therefore, there is a demand for higher radiant efficiency and higher focussing efficiency for the exposure light source.

In a mercury short arc lamp, Xe is ordinarily filled as the buffer gas in order to improve the starting characteristic of the lamp and achieve a heat insulation effect of the gas and the arc tube.

Furthermore, it is has also been proposed that rare gases other than Xe with a pressure of less than 10 atm be filled, for example, as can be taken from the patent disclosure document of Japanese patent application SHO 54-086979. However, these rare gases are filled in many cases as the starting gas to simplify starting of the discharge. The difference of the i-line output characteristic in these types of gases is not sufficiently known.

In a commercial mercury lamp of the short arc type for purposes of semiconductor exposure, besides Xe, Ar or Kr is usually hardly used as the rare gases, or if used at all, filled only at a pressure of less than 1 atm to roughly a few tenths of an atm.

As the result of intensive research by the inventors, it was found that, in a lamp in which Xe is filled as the buffer gas, when Xe is filled at greater than or equal to 8 atm, the spectral width of the i-line emitted from the lamp increases, resulting in a decrease of the image resolution of exposure.

Furthermore, it was found that in a lamp in which Ar or Kr has been filled as the buffer gas, according to the increase of lamp current based on the vigorous motion of the arc, the radiance in the vicinity of the cathode tip fluctuates, that the time fluctuation of the illuminance in the reticle area becomes greater, and that degradation of semiconductor exposure is caused.

SUMMARY OF THE INVENTION

Therefore, a primary object of the present invention is to devise a mercury lamp of the short arc type with high radiant efficiency which meets the demand for an increase of the radiation amount of the light source.

More specifically, it is an object of this invention to obtain the foregoing object by suppressing the motion of the radiance spot in the vicinity of the cathode tip to suppress the flickering of the irradiance, and thus to increase the arc stability.

These objects are achieved according to the invention in a mercury lamp of the short arc type in which, a cathode is arrange opposite an anode within an arc tube, filled together with mercury and at least one rare gas, with the rare gas being at least Ar filled at a pressure of from 1 to 8 atm at room temperature. Furthermore, the relationship:

$$10 \leq I/S(A/mm^2) \leq 250$$

is satisfied, where S is the maximum cross sectional area of the cathode between the cathode tip and an area 0.5 mm away from the tip in a direction toward the cathode body (mm$^2$) and I is the current supplied to the lamp (A).

The object is furthermore achieved in a mercury lamp of the short arc type by the at least one filled gas being Kr, by the filling pressure of this rare gas at room temperature being from 1 to 8 atm, by relationship $10 \leq I/S$ (A/mm$^2$) $\leq 310$ being satisfied, where S is the maximum cross sectional area of the cathode between the cathode tip and an area 0.5 mm away from the tip in the direction toward the cathode body (mm$^2$) and I is the current supplied to the lamp (A).

The object is also achieved in a mercury lamp of the short arc type by vertical luminous operation being accomplished in a position in which the anode is positioned above the cathode.

FIG. 5 schematically shows the shape of the arc discharge of the cathode tip. Here, a state is shown in which the arc has spread between cathode 2 and anode 3. As was described above, the maximum cross sectional area of the cathode between the tip of cathode 2 and the area 0.5 mm away in the direction toward the cathode body was fixed. In a mercury lamp of the short arc type, an arc area 5 is conventionally formed between the electrodes, proceeding from the cathode tip in the direction toward the anode body, as is illustrated in FIG. 5. The region of the cathode 2 which is surrounded by the arc is located in the area between the tip of cathode 2 and the area roughly 0.5 mm away in the direction to the cathode body. This area represents discharge area 4 of the cathode tip.

The tip area of the cathode which takes effect in a discharge is, therefore, the area between the tip and the area roughly 0.5 mm away in the direction toward the cathode body. The maximum cross sectional area of the cathode in this area is called the effective tip cross sectional area of the cathode and the diameter of this maximum cross sectional area is called the effective tip diameter of the cathode.

It is conceivable that, when Ar and Kr are used as the buffer gas, the gas temperature in the vicinity of the arc drops rapidly, because these gases have a larger heat transfer coefficient than Xe gas, and that as a result thereof the arc contracts. Due to this arc contraction, the lamp has a higher radiance than the lamp using Xe as the buffer gas and is even more similar to a point light source. Therefore, it is conceivable that the focussing efficiency of the focussing mirror is higher and consequently the irradiance on the reticle area becomes higher.

It is also possible that the arc, which in the vicinity of the cathode is in self-contraction due to the magnetic field which has formed due to the current, because of light atoms, tries to expand quickly and that instability of the arc is, therefore, caused. It is possible that the self-magnetic field and the amount of self-contraction of the arc become less when the current density decreases, and that the arc thus becomes more stable.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
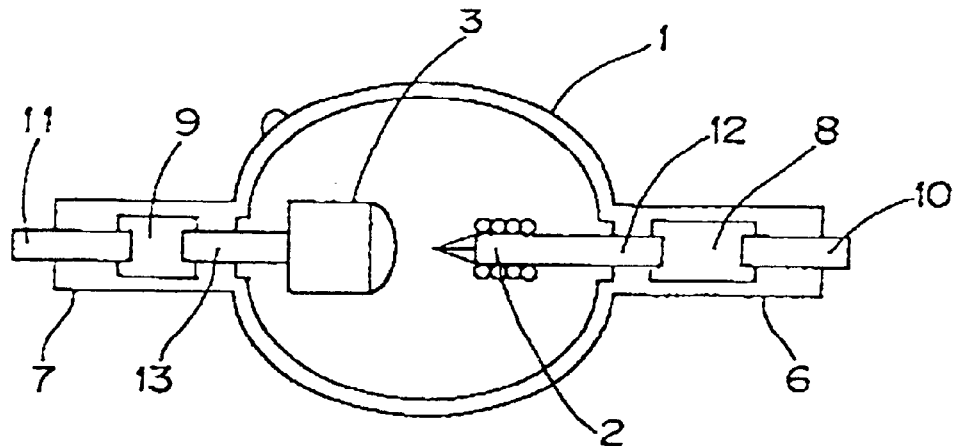
FIG. 1 shows a schematic cross section of one embodiment of the mercury lamp of the short arc type as claimed in the invention.

FIG. 1 is a schematic cross section of one embodiment of a mercury lamp of the short arc type in accordance with the present invention in which a cathode 2 and anode 3 are arranged opposite one another in a quartz glass arc tube 1. The cathode electrode 2 is connected via an inner lead component 12 to a foil 8 in a hermetically sealed portion 6 and the anode electrode 3 is connected via an inner lead component 13 to a foil 9 in a hermetically sealed portion 7. Outer lead components 10, 11 are each connected to a respective one of the foils 8, 9.

In the following a specific experimental embodiments of the invention are described.

EMBODIMENT 1

Figure 3:
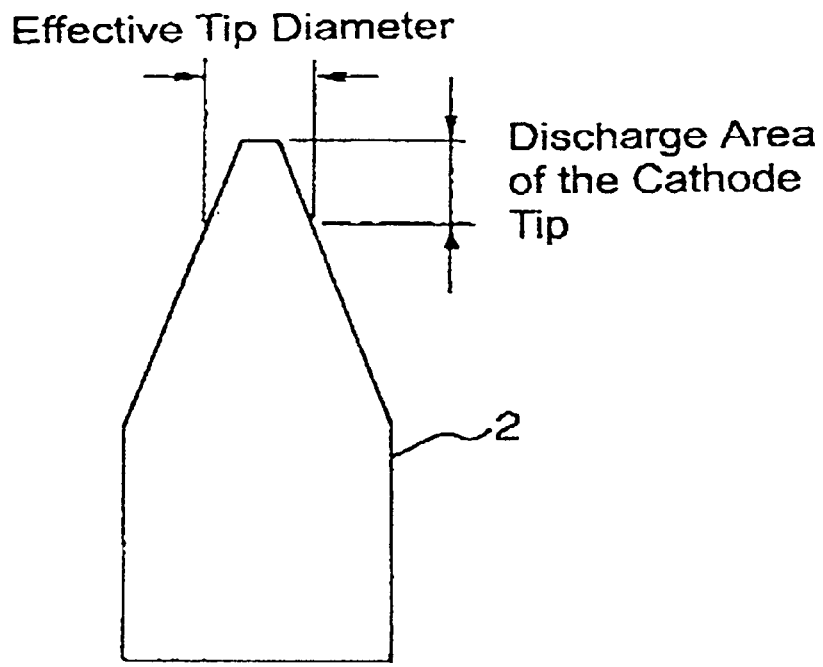
FIG. 3 shows a cross sectional representation of one cathode shape.
Figure 5:
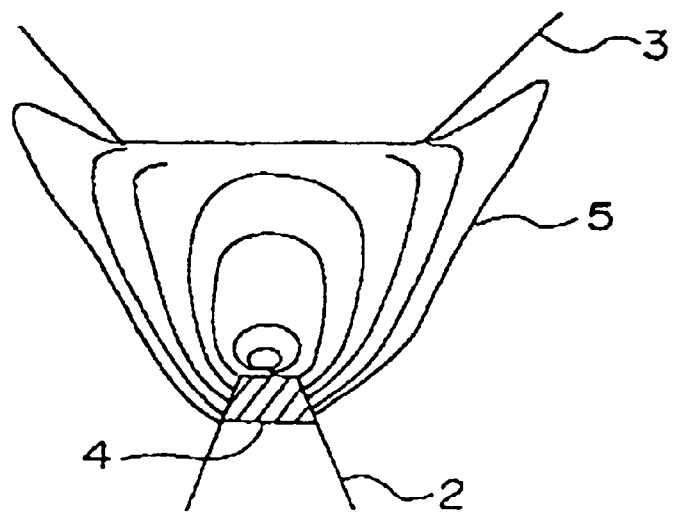
FIG. 5 is a schematic representation of the shape of the arc discharge in the electrode tip region.

Within an essentially spherical, quartz glass arc tube 1 with an outside diameter of roughly 55 mm, a tungsten anode 3 with a diameter of 20 mm was disposed opposite a tungsten cathode 2 with an effective tip diameter of 1.0 mm which contains roughly 2% by weight thorium oxide, with a distance of 4.0 mm between the electrodes. 4.5 mg/cc mercury per unit of volume was encapsulated in the lamp which also had 2 atm Xe encapsulated at room temperature. This lamp is called reference lamp A with respect to evaluation of the invention. FIG. 3 schematically shows the cathode shape in cross section.

Furthermore, five types (B1 through F1) of lamps in which Ar was filled as per Table 1, and five types (B2 through F2) of lamps in which Kr was filled, i.e., a total of ten types of lamps, were produced which, except for the filled gas, were the same as the above described reference lamp A. The lamps were operated by means of a constant power current source with an input power of roughly 2100 W. The lamps were operated in a position in which the cathode was positioned above the anode.

TABLE 1

Experimental lamps which were tested

| Lamp no. A | Ar pressure (atm) without encapsulation | Lamp no. A | Kr pressure (atm) without encapsulation |
|---|---|---|---|
| B1 | 0.3 | B2 | 0.3 |
| C1 | 1.0 | C2 | 1.0 |
| D1 | 3.0 | D2 | 3.0 |
| E1 | 8.0 | E2 | 8.0 |
| F1 | 12.0 | F2 | 12.0 |

Figure 2:
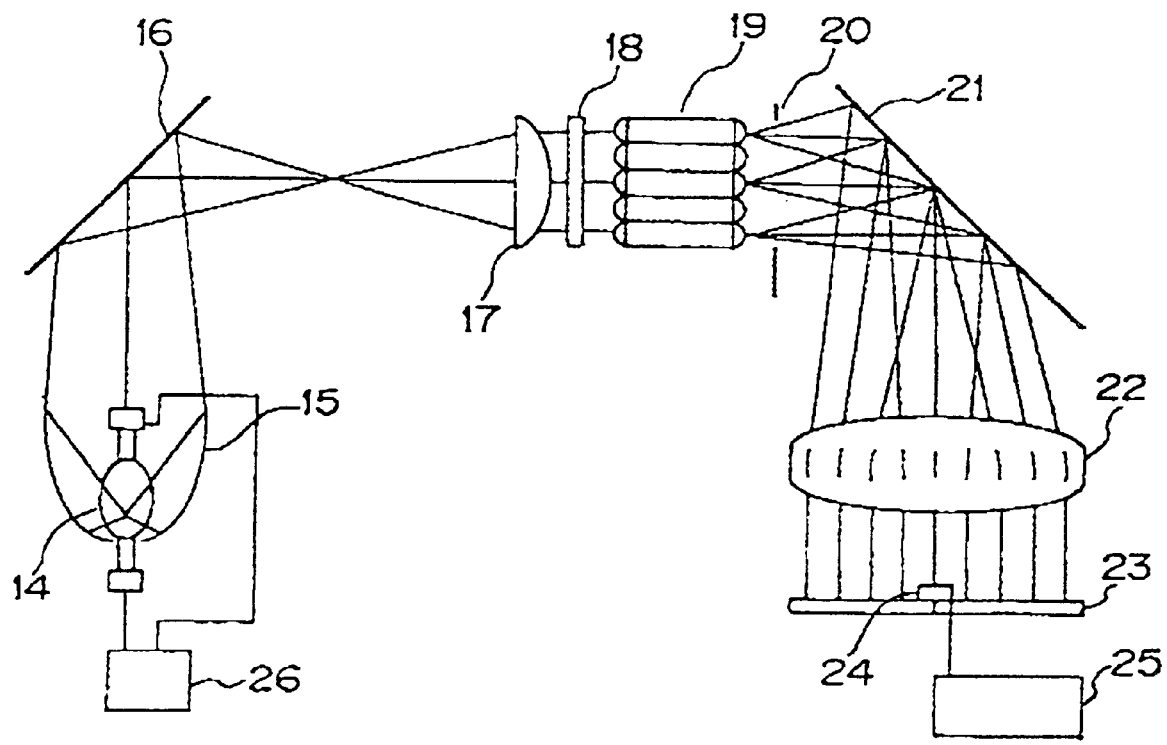
FIG. 2 shows a schematic of an optical system in which the relative i-line intensity of the mercury lamp of the short arc type of the invention is measured.

The irradiance of the i-line of the lamps was measured by means of the optical system shown in FIG. 2. This means that the light which has emerged from lamp 14 passes via oval mirror 15 and first flat reflector 16 to collimation lens 17 and bandpass filter 18 with a primary wavelength of 365 nm and a bandwidth of 10 nm, through integrator lens 19, is reflected by second flat reflector 21, passes through condenser lens 22 and reaches reticle area 23. On reticle area 23, there is a silicon photodiode detector 24 with a position which is always fixed. The respective lamp was operated and the irradiance of the i-line was measured. Table 2 shows the result using lamps A, B1 through F1.

TABLE 2

Ar gas pressure and relative i-line irradiance

| Lamp no. | Pressure (atm) | Voltage (V) | Current (A) | Relative i-line irradiance |
|---|---|---|---|---|
| A  | Xe(2)   | 26.9 | 78.1 | 1.00 |
| B1 | Ar(0.3) | 25.1 | 83.7 | 1.02 |
| C1 | Ar(1)   | 25.6 | 82.0 | 1.04 |
| D1 | Ar(3)   | 26.6 | 78.9 | 1.12 |
| E1 | Ar(8)   | 27.4 | 76.6 | 1.18 |
| F1 | Ar(12)  | 28.5 | 73.7 | 1.20 |

Here, it is assumed that the measurement error of the irradiance of the light is usually 1 to 2%. For a measurement error of greater than 4%, the so-called throughput in an exposure process in semiconductor manufacture is clearly improved. Based on these circumstances, it was ascertained as the result that, in a case in which the relative i-line irradiance compared to reference lamp A was increased by greater than or equal to 4%, improved action by the filling of the Ar gas was obtained.

If lamp D1, in which 3 atm Ar was filled, is compared to lamp A, in which 2 atm Xe are filled, in the case of using the lamp by placing it on an exposure device, the irradiance of the UV rays of the i-line on the reticle area of lamp D1 compared to lamp A1 increased by roughly 12%.

In lamp F1, in which Ar with an encapsulation pressure of 12 atm is encapsulated at room temperature in the arc tube, the i-line irradiance increased by 20%. Here, however, the spectral width of the i-line was broadened; this caused a reduction of image resolution during exposure.

As was described above, the test using a lamp as a heating apparatus indicated that the relative i-line irradiance on the reticle area is effectively increased when Ar is filled at 1 atm to 8 atm.

Furthermore, using lamps in which Kr with 3 atm is filled as the buffer gas, a test was run in the same way. Table 3 shows the result using lamps B2 through F2. As can be derived from Table 3, it was confirmed that the i-line irradiance compared to the lamp in which Xe is filled was increased by roughly 8%.

In lamp F2, in which in the arc tube Kr with an filling pressure of 12 atm is filled at room temperature, as in the case of Ar, the i-line irradiance increased by 15%. Here, however, the spectral width of the i-line was widened; this caused a drop in the image resolution during exposure.

As was described above, the test using a lamp as the heating apparatus indicated that the relative i-line irradiance on the reticle area is effectively increased when Kr is encapsulated at 1 atm to 8 atm.

TABLE 3

Kr gas pressure and relative i-line irradiance

| Lamp no. | Pressure (atm) | Voltage (V) | Current (A) | Relative i-line irradiance |
|---|---|---|---|---|
| A | Xe(2) | 26.9 | 78.1 | 1.00 |
| B2 | Kr(0.3) | 25.4 | 82.7 | 1.01 |
| C2 | Kr(1) | 25.9 | 81.1 | 1.04 |
| D2 | Kr(3) | 27.0 | 77.8 | 1.08 |
| E2 | Kr(8) | 27.9 | 75.3 | 1.13 |
| F2 | Kr(12) | 29.0 | 72.4 | 1.15 |

EMBODIMENT 2

In four lamps with the same equation specification as in the test in embodiment 1, Ar and a mixed gas which contains Ar and Xe were filled. Table 4 shows these four lamps G1 through K1.

If, with respect to the Ar filling pressure, the Xe filling pressure is increased, a decrease of the i-line irradiance on the reticle area is observed. As one example, the relative values of the i-line irradiance on the reticle area with reference to lamp A are shown in Table 4. This result shows that, at a Xe filling pressure which is roughly triple that of the Ar filling pressure, the effect of increasing the i-line irradiance is observed; however, at a higher Xe filling pressure, a clear increase of the i-line irradiance cannot be obtained. Therefore, with respect to the increase of i-line irradiance on the reticle area, it is desirable that the Xe filling pressure is set roughly three times as high as the Ar filling pressure.

TABLE 4

Outline of experimental lamps for studying the Ar-Xe pressure and the relative i-line irradiance

| Lamp no. | Xe (atm) | Ar (atm) | Relative i-line irradiance |
|---|---|---|---|
| G1 | 0 | 1.0 | 1.06 |
| H1 | 0.3 | 1.0 | 1.06 |
| J1 | 3 | 1.0 | 1.04 |
| K1 | 8 | 1.0 | 1.02 |

Furthermore, it was found that, even in the case of filling of Kr instead of Ar, the result shown in Table 5 is obtained, and that it is also advantageous that the Xe filling pressure is set roughly three times as high as the Kr filling pressure.

TABLE 5

Outline of experimental lamps for studying the Kr-Xe pressure and the relative i-line irradiance

| Lamp no. | Xe (atm) | Kr (atm) | Relative i-line irradiance |
|---|---|---|---|
| G2 | 0 | 1.0 | 1.04 |
| H2 | 0.3 | 1.0 | 1.04 |
| J2 | 3 | 1.0 | 1.03 |
| K2 | 8 | 1.0 | 1.01 |

EMBODIMENT 3

In the following, the result of studying and measuring the arc stability is shown using Table 6. Lamps L1 to O1 were produced experimentally with the same shape as the experimental lamps in embodiment 1, but with mercury in an amount of 4.5 mg/cc and the rare gases Ar in an amount of 3 atm and Kr in an amount of 0.5 atm being filled, and with the effective tip diameter of the cathode having been changed. A constant current source was used for operation of the lamps.

TABLE 6

Outline of lamps used to study arc stability, and the result

| Lamp no. | Effective cathode tip diameter (mm) | Current (A) | Voltage (V) | I/S (A/mm$^2$) | Arc stability % |
|---|---|---|---|---|---|
| L1 | 0.6 | 30 | 23.2 | 106 | 1,0 |
|  | 0.6 | 60 | 25.5 | 212 | 2.9 |
|  | 0.6 | 90 | 26.7 | 318 | 5.9 |
|  | 0.6 | 120 | 28.0 | 424 | 8.6 |
| M1 | 0.7 | 30 | 23.4 | 78 | 0.8 |
|  | 0.7 | 60 | 25.8 | 160 | 1.8 |
|  | 0.7 | 90 | 26.3 | 234 | 3.4 |
|  | 0.7 | 120 | 27.8 | 312 | 5.6 |
| N1 | 1.0 | 30 | 23.2 | 39 | 0.6 |
|  | 1.0 | 60 | 25.5 | 76 | 0.8 |
|  | 1.0 | 90 | 26.5 | 114 | 1.1 |
|  | 1.0 | 120 | 27.9 | 153 | 1.5 |
| O1 | 1.5 | 30 | 23.4 | 17 | 0.5 |
|  | 1.5 | 60 | 25.4 | 34 | 0.6 |
|  | 1.5 | 90 | 26.5 | 51 | 0.5 |
|  | 1.5 | 120 | 27.8 | 68 | 0.6 |

Figure 4:
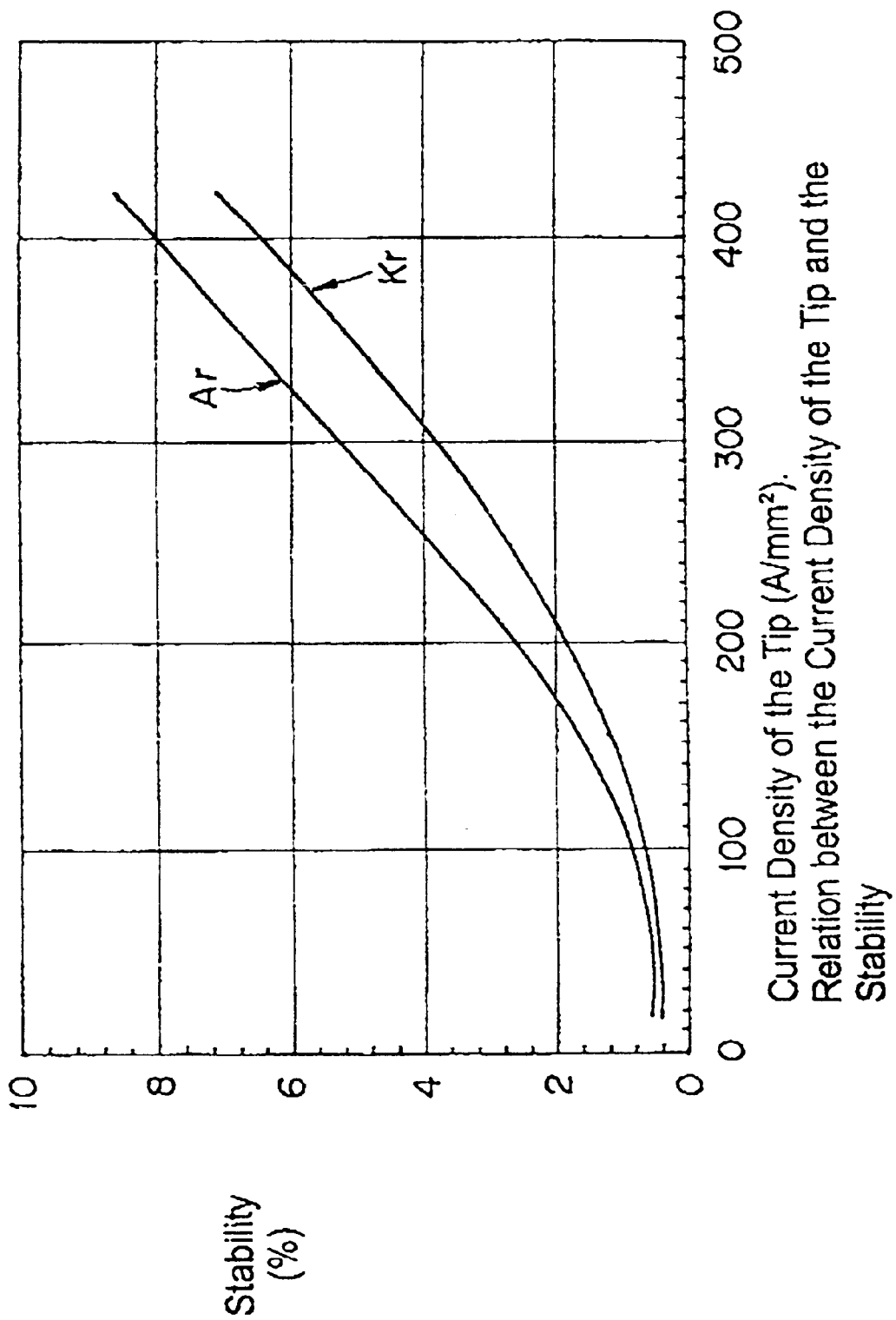
FIG. 4 is a graph of the relation between arc stability and the current density of the cathode tip.

The measurement process is described in the following. Evaluation of the arc stability is represented by 2(MA−MI)/(MA+MI)×100%, the maximum value of the light output signal which is measured by means of silicon photodiode detector 24 on reticle area 23 shown in FIG. 2 being labeled MA and the minimum value being labelled MI. Usually, it is assumed that at an arc stability of 5% irradiation nonuniformity in exposure burning does not occur. FIG. 4 shows the results in Table 6 using a graphic representation. These results show that an area in which the ratio of the current supplied to the lamp (in amperes) relative to the effective cross sectional area of the cathode tip (in square millimeters), i.e., the current density of the cathode tip I/S, is 10 to 250 (A/mm$^2$), represents a condition suitable for stabilization of the arc.

In lamps in which 3 atm Kr and 0.5 atm Xe were filled, the arc stability was measured by changing the effective cross sectional area of the cathode tip; the result is shown in Table 7 and FIG. 4. As in the case of Ar, it was found that the area in which the ratio of the current supplied to the lamp relative to the effective area of the cathode tip, i.e., the current density of the cathode tip I/S, is 10 to 310 (A/mm$^2$), represents a condition suitable for stabilization of the arc.

TABLE 7

Outline of lamps used to study arc stability, and the result

| Lamp no. | Effective cathode tip diameter (mm) | Current (A) | Voltage (V) | I/S (A/mm²) | Arc stability % |
|---|---|---|---|---|---|
| L2 | 0.6 | 30 | 23.6 | 106 | 0.7 |
|  | 0.6 | 60 | 26.0 | 212 | 1.9 |
|  | 0.6 | 90 | 26.5 | 318 | 4.3 |
|  | 0.6 | 120 | 28.4 | 424 | 7.1 |
| M2 | 0.7 | 30 | 23.9 | 78 | 0.6 |
|  | 0.7 | 60 | 26.3 | 160 | 1.2 |
|  | 0.7 | 90 | 26.7 | 234 | 2.5 |
|  | 0.7 | 120 | 28.7 | 312 | 4.1 |
| N2 | 1.0 | 30 | 23.7 | 39 | 0.4 |
|  | 1.0 | 60 | 26.1 | '76 | 0.6 |
|  | 1.0 | 90 | 26.9 | 114 | 0.8 |
|  | 1.0 | 120 | 28.4 | 153 | 1.2 |
| O2 | 1.5 | 30 | 23.9 | 17 | 0.4 |
|  | 1.5 | 60 | 25.8 | '34 | 0.4 |
|  | 1.5 | 90 | 27.1 | 51 | 0.5 |
|  | 1.5 | 120 | 28.4 | 68 | 0.5 |

Among the experimental lamps produced in embodiment 3, lamp L1 and M1 which have a fixed arc stability, and reference lamp A were used and operated such that the anode is positioned above the cathode. In this way, arc stability was measured. For the current source, a constant power current source was used. Table 8 shows the result.

TABLE 8

Lamp position in operation and arc stability

| Lamp no. | Position during operation | Current (A) | Voltage (V) | Arc stability (%) |
|---|---|---|---|---|
| A (ref.) | Cathode at top | 82.4 | 25.5 | 1.0 |
|  | Anode at top | 82.7 | 25.4 | 0.8 |
| l1 (ar) | Cathode at top | 80.5 | 26.1 | 5.0 |
|  | Anode at top | 81.1 | 25.9 | 1.4 |
| M1 (Ar) | Cathode at top | 75.3 | 27.9 | 4.4 |
|  | Anode at top | 75.5 | 27.8 | 1.8 |

The result in Table 8 shows that, for lamps L1 and M1 in which Ar is filled, during operation with an anode pointed upward the arc stability is dramatically increased. If operation is accomplished in a position inclined by roughly greater than or equal to 35% with respect to the horizontal from the direction of the normal, the arc becomes unstable.

It is assumed that usually in a mercury lamp of the short arc type, by operation with a position in which the anode is pointed downward, the temperature of the coolest part in the lower area of the arc tube is reduced and that this is used effectively to prevent failure of the mercury to vaporize during operation. However, operation can also be achieved in a state in which the anode is positioned at the top by providing the cathode side of the outer wall of the arc tube with a heat insulating film or the like.

As was shown here, the fluctuation of the irradiance on the reticle area of lamps L1 and M1 with filling of Ar decreases from ⅓ to ¼, if operation with an anode pointed upward is compared to operation with an anode pointed downward.

Furthermore, in a lamp with filling of Kr, in the same manner, it became apparent that, in operation with an anode pointed upward, the arc stability is dramatically increased, as is shown in Table 9. If operation in a position sloped by roughly greater than or equal to 35% with reference to the horizontal from the direction of the normal was performed, the arc became unstable.

TABLE 9

Lamp position in operation arc stability

| Lamp no. | Position during operation | Current (A) | Voltage (V) | Arc stability (%) |
|---|---|---|---|---|
| A (ref.) | Cathode at top | 82.4 | 25.5 | 1.0 |
|  | Anode at top | 82.7 | 25.4 | 0.8 |
| L2 (Kr) | Cathode at top | 76.9 | 27.3 | 3.1 |
|  | Anode at top | 77.8 | 27.0 | 1.2 |
| M2 (Ar) | Cathode at top | 72.7 | 28.9 | 3.0 |
|  | Anode at top | 73.2 | 28.7 | 1.1 |

Embodiments were shown above in which Ar and Kr were each filled individually as the primary buffer gas. However, the same results can be obtained when Ar and Kr are filled together as the buffer gas.

Action of the Invention

As is described above, in a mercury lamp of the short arc type in which at least Ar is filled as the rare gas, by an filling pressure of the above described rare gas from 1 to 8 atm and by fixing the ratio of the lamp current (I) to the effective cross sectional area of the cathode tip (S), i.e., ratio I/S, at 10 to 250 (A/mm²), the radiant efficiency, the irradiance of the i-line, and thus the arc stability can be increased. Alternatively, by filling of at least Kr as the above described at least one rare gas at an filling pressure of this rare gas of from 1 to 8 atm, and by fixing I/S at 10 to 310 (A/mm²), the radiant efficiency and thus the irradiance of the i-line can be increased. In this way, a discharge lamp with high radiant efficiency can be devised with which the demand for an increase of the amount of radiation of the light source is satisfied.

Furthermore, by operation of the above described mercury lamp of the short arc type such that the anode is positioned above the cathode, the fluctuation of the bright spot of the cathode can be suppressed and the arc stability increased.

It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. Mercury lamp of the short arc type comprising an arc tube within which cathode and anode electrodes are positioned opposite one another and in which mercury and at least one rare gas are filled, wherein at least Ar is encapsulated as the at least one rare gas at a filling pressure at room temperature of from 1 to 8 atm; and wherein the maximum cross-sectional area of the cathode between a tip of the cathode and an area 0.5 mm away from the tip in a direction toward the cathode body S, in mm², is set at a value which satisfies the relationship $10 \leq I/S$ (A/mm²) $\leq 250$, where I is the current, in amperes (A), to be supplied to the electrodes during operation of the lamp.

2. Mercury lamp of the short arc type as claimed in claim 1, wherein the anode is positioned above the cathode.

3. Mercury lamp of the short arc type comprising an arc tube within which cathode and anode electrodes are positioned opposite one another and in which mercury and at least one rare gas are filled, wherein at least Kr is filled as the at least one rare gas at a filling pressure at room temperature of from 1 to 8 atm; and wherein a maximum cross-sectional area of the cathode between a tip of the cathode and an area 0.5 mm away from the tip in a direction toward the cathode body S, in mm$^2$, is set at a value which satisfies the relationship $10 \leq I/S$ (A/mm$^2$)$\leq 310$, where I is the current, in amperes (A), to be supplied to the electrodes during operation of the lamp.

4. Mercury lamp of the short arc type as claimed in claim 3, wherein the anode is positioned above the cathode.

5. Process of operating a mercury lamp of the short arc type comprising an arc tube within which cathode and anode electrodes are positioned opposite one another and in which mercury and at least one rare gas are filled, Ar being filled as the at least one rare gas at an filling pressure at room temperature of from 1 to 8 atm;

wherein the lamp is operated by supplying an electrical current I, in amperes (A), to the electrodes which satisfies the relationship $10 \leq I/S$ (A/mm$^2$)$\leq 250$ during operation of the lamp, where S is a value in mm$^2$ of a maximum cross-sectional area of the cathode between a tip of the cathode and an area 0.5 mm away from the tip in a direction toward the cathode body.

6. Process of operating mercury lamp of the short arc type as claimed in claim 5, wherein the anode is positioned above the cathode during operation of the lamp.

7. Process of operating a mercury lamp of the short arc type comprising an arc tube within which cathode and anode electrodes are positioned opposite one another and in which mercury and at least one rare gas are encapsulated, at least Kr being filled as the at least one rare gas at an filling pressure at room temperature of from 1 to 8 atm; wherein the lamp is operated by supplying an electrical current I, in amperes (A), to the electrodes which satisfies the relationship $10 \leq I/S$ (A/mm$^2$)$\leq 310$ during operation of the lamp, where S is a value in mm$^2$ of a maximum cross-sectional area of the cathode between a tip of the cathode and an area 0.5 mm away from the tip in a direction toward the cathode body.

8. Process of operating a mercury lamp of the short arc type as claimed in claim 7, wherein the anode is positioned above the cathode during operation of the lamp.

* * * * *